United States Patent
Pini (10) Patent No.: US 9,151,517 B2
(45) Date of Patent: Oct. 6, 2015

(54) SUBSTANTIALLY TWO-DIMENSIONAL CONSTRUCTION ELEMENT

(75) Inventor: Niccolo Pini, Zürich (CH)

(73) Assignee: DESIGNERGY SA, Lugano (CH)

( * ) Notice: Subject to any disclaimer, the term of this patent is extended or adjusted under 35 U.S.C. 154(b) by 352 days.

(21) Appl. No.: 13/516,836

(22) PCT Filed: Dec. 16, 2010

(86) PCT No.: PCT/EP2010/069864
§ 371 (c)(1),
(2), (4) Date: Jul. 5, 2012

(87) PCT Pub. No.: WO2011/073303
PCT Pub. Date: Jun. 23, 2011

(65) Prior Publication Data
US 2012/0260587 A1    Oct. 18, 2012

Related U.S. Application Data

(60) Provisional application No. 61/287,407, filed on Dec. 17, 2009.

(51) Int. Cl.
*E04D 13/18* (2014.01)
*E04H 14/00* (2006.01)
(Continued)

(52) U.S. Cl.
CPC ............... *F24J 2/0444* (2013.01); *F24J 2/045* (2013.01); *H01L 31/048* (2013.01); *H02S 20/23* (2014.12); *H02S 40/44* (2014.12); *H01L 31/0482* (2013.01); *Y02B 10/12* (2013.01); *Y02B 10/14* (2013.01);
(Continued)

(58) Field of Classification Search
CPC ....... H01L 31/048; H02S 20/23; Y02B 10/12; Y02B 10/14; Y02B 10/20; Y02E 10/50
USPC .................. 136/251, 259, 243, 244; 52/173.3
See application file for complete search history.

(56) References Cited

U.S. PATENT DOCUMENTS 5,800,631 A    9/1998  Yamada et al.
6,331,673 B1 *  12/2001  Kataoya et al. ............... 136/259
(Continued)

FOREIGN PATENT DOCUMENTS

EP    0 788 171 A2    8/1997
EP    0 829 909 A2    3/1998
(Continued)

OTHER PUBLICATIONS

International Search Report and Written Opinion for international Application No. PCT/EP2010/069864; International Filing Date: Dec. 16, 2010.

*Primary Examiner* — Chi Q Nguyen
(74) *Attorney, Agent, or Firm* — Oliff PLC (57) ABSTRACT

A construction element (29) which extends in two dimensions comprises a solar energy converter member (1) which also extends along and defines one surface of the construction element (29). The construction element (29) further comprises a building construction member (30) which extends along the construction element (29) and defines the second surface thereof. At least a part of the solar energy converter member (1) is integral with at least a part of the building construction member (30) whereby this integral part both contributes to the requirements for solar energy conversion as well as to requirements for constructions.

30 Claims, 4 Drawing Sheets

(51) Int. Cl.
  *F24J 2/04*    (2006.01)
  *H02S 20/23*   (2014.01)
  *H02S 40/44*   (2014.01)
  *H01L 31/048*  (2014.01)

(52) U.S. Cl.
  CPC  *Y02B 10/20* (2013.01); *Y02B 10/50* (2013.01); *Y02B 10/70* (2013.01); *Y02E 10/44* (2013.01); *Y02E 10/50* (2013.01); *Y02E 10/60* (2013.01)

(56) References Cited

U.S. PATENT DOCUMENTS

| | | | |
|---|---|---|---|
| 2003/0010377 A1 | 1/2003 | Fukuda et al. | |
| 2005/0000560 A1 | 1/2005 | Shiotsuka et al. | |
| 2008/0041443 A1* | 2/2008 | O'Connell et al. | 136/256 |
| 2009/0014051 A1 | 1/2009 | Gumm | |
| 2009/0283136 A1* | 11/2009 | Munch et al. | 136/251 |
| 2010/0212740 A1* | 8/2010 | Barth et al. | 136/259 |

FOREIGN PATENT DOCUMENTS

| | | |
|---|---|---|
| EP | 0 836 233 A2 | 4/1998 |
| EP | 0 935 295 A2 | 8/1999 |
| EP | 2 034 522 A2 | 3/2009 |
| EP | 2 093 804 A1 | 8/2009 |
| EP | 2 336 448 A2 | 2/2011 |
| JP | H09-125607 A | 5/1997 |
| JP | H10-62017 A | 3/1998 |
| JP | H10-131409 A | 5/1998 |
| JP | 2001-068716 A | 3/2001 |
| JP | 2002-094103 A | 3/2002 |
| JP | 2003-314011 A | 11/2003 |
| JP | 2004-197560 A | 7/2004 |

* cited by examiner

SUBSTANTIALLY TWO-DIMENSIONAL CONSTRUCTION ELEMENT

RELATED APPLICATION

This is a U.S. national phase application under 35 U.S.C. §371 of International Application No. PCT/EP2010/069864 filed Dec. 16, 2010 with claiming priority of U.S. provisional application No. 61/287,407 filed Dec. 17, 2009, the disclosure of which is hereby incorporated by reference.

0. DEFINITIONS

Under "substantially two-dimensional construction element" it is meant an element which is basically displaying a plate shape with a front and a back surface and whereas the thickness in the third dimension is lower than the length and the with of the plate; the plate can of course not only be perfectly planar but also from slightly curved to heavily curved Under "Structurally Integrated Solar Building Element (SISBE)" it is meant a construction element fitting into the scope of the disclosure and all claims of the present invention and particularly including a solar energy converter member being integral with at least a part of a (building) construction member and the resulting integral part both contributing to solar energy conversion and to (building) construction requirements Under "Building Integrated Photovoltaics (BIPV)" it is meant, according to the state of the art wording used in the photovoltaic (pv) industry, a construction element with a solar energy converter member and where integrated mainly means "substituted and adapted"; in the present invention BIPV may include also other solar energy converter technologies other than the pv one.

1. TECHNICAL FIELD

The diffusion of photovoltaic systems is still very slow since the final users look for shortest possible investment pay-back times and without the very attractive government driven subvention policies the technological progress has not provided yet very advantageous solutions.

Concerning constructions, particularly roof top solar installations on buildings, most of the systems commercially available are an additional structure that needs to be applied on the existing construction and this even in the better integrated Building Integrated Photovoltaics (BIPV) existing so far which usually cost even more because of not synergetic substitution and adaptation of the BIPV element with the building part adjacent to it and they are used primarily to provide a more aesthetically uniform roof top solar installation.

Therefore the goal for photovoltaic applications in general and particularly for BIPV in order to further optimize cost structures of building and solar system owners, is to at least partially use the modules as structural components of a building or any other kind of construction that according to a preferred embodiment of the present invention are defined as structurally integrated solar building element (SISBE). A SISBE has tremendous advantages because the need to first build a roof and then apply photovoltaic systems can be avoided; further the need to substitute shingles with a pv module and than adapt it to a standard roof structure as it is the case for BIPV installations can also be avoided since SISBEs imply at least a part of a solar energy converter member being integral with at least a part of a building construction member and the resulting integral part both contributing to solar energy conversion and to building construction requirements. Costs can therefore be drastically sunken: from a two-piece system (normal building component as previously mentioned, plus solar system) or a one-piece system with the "substitute and adapt" approach of a standard BIPV approach to an inventive one-piece system where integration of at least a part of a solar converter with at least a part of a building construction member provides new and improved synergies: a structural solar converter application matching for example thermal, mechanical and chemical characteristics usually required in modern building construction.

More particularly SISBEs placed on roofs have to be mechanically tough. Rigidity is also an important feature for example in order to avoid cracks in pv cells due to the typical deformation of modules caused by wind or snow. Further they have to solve the big problem of thermal insulation usually needed for a building. Therefore a preferred embodiment of the present invention will provide a structure solving such problems and easily adaptable to different solar energy caption technologies as pv, thermal, hybrid technologies.

2. DISCUSSION OF PRIOR ART

BIPV modules without SISBE features are well known on the market and include many approaches relying on the different available pv technologies as crystalline or thin film silicon materials for example.

In order to better understand the application area of the invention let's first analyze how a building structural part is usually constituted. As an example but not as a limitation, a complete construction of a pitched roof in central Europe usually needs: massive wood (pine or similar) joists, cladding with 2 cm thick wood, vapor barrier (transpiring cover), 10 cm thick thermal insulation, a further layer composed of 2 cm thick wood boards, a second impermeable cover and a cover made of tiles.

On this or similar flat, saw toothed or any other kind of building covering surfaces, usually a solar system is separately placed in a second step. In case of BIPV the module is the most external part of the roof's surface and it substitutes shingles while being adapted to the underlying roof structure. Similar can be done on buildings' walls/facades.

Solar modules are mostly laminated with at least one glass that provides the required basic mechanical, thermal, electrical, chemical stability and the necessary transparency. Further in case of thin film pv modules on the back side a second glass is usually laminated although this raises the cost not irrelevantly. The goal of this particular industry is therefore to use the least possible amount of glass even if this is very risky in terms of durability and reliability as has been pointed out already.

Even if such industry trend will go on, these solar laminated or sandwich structures available in commerce, usually comprising at least one glass plate that possesses decent starting properties, fulfil only partially building construction roofing norms.

For example, whatever is the solar technology considered (bulk crystalline Si, thin film technologies, flexible modules, organic, solar thermal or hybrid) all modules have one important mechanical limit: they all withstand a certain amount of pressure namely 240 kg/m2 for one hour according to IFC 61215 and IEC 61646 for pv norms as example.

For the present invention this has to be confronted with building norms: according for example to Swiss building norms for roofs (SIA), instant pressures, wind, snow and other factors have to be calculated in order to provide a safe structural toughness and all these parameters added up usually go far beyond the 240 kg/m2.

Since, for example some very tough double glass sandwich thin film modules present on the market do already have decent mechanical properties they are interesting candidates for example for standard BIPV roofing solutions. Though, glass is a ceramic material that according to Weibull's distribution sometimes collapses at significantly low mechanical loads. According to the example of the sandwiched thin film modules just introduced, basic mechanical stability of a laminated double glass is very good and similar to the one of a car windscreen that only has to withstand wind and hail at higher velocity but not the weight of persons and other heavy and badly distributed constant or, even worse, instantly applied weights as it may happen on constructions as for instance on roofs. In fact when a roof is mounted, serviced, or dismantled men at work have to be able to safely move and work on it. Further if a house, covered with a roof comprising a pv installation, is close to mountains, woods or a garden, flying or falling rocks or tree branches have to leave the pv system on the roof undamaged or at least in such a state to not change pv modules and/or tiles every time the weather conditions get worse. In the cited IEC norms there is also a hail test but this may not be sufficient if the module is required to survive 25 years: the test requires to fire a single ice ball of 2.5 cm diameter in ten different locations of a module; in nature a single hail storm would fire hundreds if not thousands of ice balls and if one of them impacts on a particularly sensitive point of the module's front glass which has not been impacted during IEC testing the module would potentially crack and therefore an enhanced rigidity and toughness would be helpful. Further, getting back to the windscreen's example, when it gets cracked it can still last for some time without losing any of its required properties apart maybe the pre-crack complete transparency.

Therefore, in case of a BIPV system it would just be economically unbearable to substitute a broken one with a new one just because of an external pressure that particularly in case of roof top installations may happen often due to roof and/or solar system servicing. The solution of using thicker, heavier and even more expensive glass is not aligned with the purpose of the renewable energies coming from the sun, namely providing an economically advantageous solution versus fossil sources.

Further, and probably even more important for the purpose of the invention, commercially available solar modules transmit way to much heat on the back side. Thermal conductivity is a problem that everybody is aware of: the heat that a car interior bears after staying even less than an hour in the sun or of the heat that gets trapped by a greenhouse. Thermal properties are also problematic in case of BIPV. A pv module heats up to temperatures reaching even 100° C. in arid and sunny regions while normally they reach around 60 to 80° C. while a solar thermal can go well beyond this limit to almost around 150° C. and even beyond. It is easily imaginable that such high temperatures may not happen in a cold Northern winter but already in a central Europe summer, where the solar systems have an interesting yield they could just raise temperatures in roof floors to humanly unbearable temperatures that also would mean tremendous thermal energy wastes. On top of that it shall be reminded that in case of pv technologies crystalline modules electrically perform poorer with raising temperatures. This applies also to thin film technologies although less relevantly while it may not apply at all for thermal collectors.

Therefore as long as BIPV modules have to assume glazing or façade covering roles they are expensive and technologically less problematic, but as soon as they need to be directly used as tile or other roofing or building's element the mechanical and thermal properties do not match requirements at all.

3. WHAT IS THE OBJECT UPON WHICH THE INVENTION RESIDES

The purpose of this invention is therefore to provide a light, economical, environmental friendly structurally integrated photovoltaic building element (SISBE) with superior properties as for instance mechanical and thermal ones so that they can respect required building norms too.

4. THE SOLUTION

A substantially two-dimensional construction element for construction, comprising
  a solar energy converter member extending along and defining one surface of said construction element and providing for solar energy conversion;
  a building construction member, extending along and defining the second surface of said construction element and providing for construction requirements characterised by the fact that at least a part of said converter member is integral with at least a part of said construction member and said resulting integral part both contributes to said solar energy conversion and to said construction requirements.

A first preferred embodiment is to provide a solar module with at least two different material layers at its backside in order to form a sandwich structure with elevated thermal insulation and outstanding mechanical properties as toughness and rigidity in order to make it a SISBE that can be used directly both as one-piece solar energy capting and as external building constructing element. Starting from the back surface of the module said two material layers may comprise a core material layer and a back surface sandwich material layer. In case the module is only partially acting as front surface sandwich material layer a dedicated layer has to be introduced into the SISBE between module and core material layer in order to provide the required properties.

Such a sandwich structure applicable to all market available solar modules includes for example a front fibre reinforced thermoplastic or thermoset laminate that can be applied to the backside of a module by different means as for example gluing or by simply heating up the thermoplastic or thermoset structures of the sandwich front side in order to bond it to the back side of a module. Further the core material of the sandwich may preferably but not limitedly be a foam like material and on the back side the sandwich may comprise the same or similar fibre reinforced thermoplastic or resin laminate used for the front side of said sandwich structure. Instead of fibres other materials can be used too.

5. WHY IS THAT A SOLUTION

Close prior art is held in U.S. Pat. No. 5,800,631. Though, the realization of such an approach is unrealistic. The limits of this type of structure mainly concern the rigidity that can be achieved by such a structure because of the not advantageous material combination at the back side of the module. Further, the insulating capabilities (particularly to vapour and electricity) on the back side of the module become questionable in reason of the presence of dry fibres in or adjacent to a foam layer, independently from the additional presence of adhesion layers in such a structure. Dry fibres are also known to provide insufficient insulating capabilities. Further the total absence of glass in the front or in the back of the photoactive material is a clear sign of bad durability. Finally this design can't exploit economies of scale reached by present module producers since it requires a totally different solar module encapsulation method that needs to be industrially developed since it does not apply to a finished or semi finished module available on the market as such or only with slight and easily realizable changes. Further on the very thin foam layers used are sign for very bad heat insulation capabilities.

6. ONE SPECIFIC EMBODIMENT OF THE INVENTION AFTER THE OTHER

The core of the invention according to a first preferred embodiment is to provide a solar module with at least two different material layers at its backside in order to form a itself needs to fulfil the already mentioned electrical and chemical insulating parameters.

As already mentioned, in a further embodiment the front side sandwich material layer structure may comprise to a large extent the solar module itself. In this case the foam like material may be attached in a different way to the solar module as for example by gluing. This may also work if the solar module has only a front glass and not a double glazed structure. In any case the foam may be directly applied by gluing on the back electrode or on the back reflector of a pv module or on the back surface of a thermal collector. It is obvious that in such a configuration the solar module itself needs to fulfil the electrical and chemical insulating requirements, too.

Different materials can be included in the sandwich structure. In following table a few examples are provided; these are meant to be explanatory but not as limiting factor of the scope of the invention and its claims.

| Front side sandwich - mat. layer | | Core material sandwich | Back side sandwich - mat. layer | |
|---|---|---|---|---|
| Reinforcement | Matrix | Core material | Reinforcement | Matrix |
| glass fibre | Polypropylene | Polypropylene foam | glass fibre | polypropylene |
| glass fibre | epoxy resin | PMI foam | glass fibre | epoxy resin |
| glass fibre | polyesther resin | PUR foam | glass fibre | Polyesther resin |
| glass fibre | Vinylesther resin | Phenolic paper Honeycomb | glass fibre | vinylesther resin |
| — | polypropylene | Polypropylene honeycomb | — | polypropylene |
| — | Aluminium foil | Copolymer foams | — | Aluminium foil |
| basalt fibre | phenolic resin | Insulating carbon foam | glass fibre | phenolic resin |
| hemp fibre | epoxy resin | 3D fabric | hemp fibre | epoxy resin |
| aramide fibre | epoxy resin | PEEK foam | aramide fibre | epoxy resin |
|  | pv module | Glass foam | basalt fibre | phenolic resin |
| — | glass plate | Reinforced foams Styrene based foams | glass fibre | vinylesther resin | sandwich structure with elevated thermal insulation and outstanding mechanical properties as toughness and rigidity in order to make it a SISBE that can be used directly as one-piece solar energy capting and external building constructing element. Starting from the back surface of the module said two material layers may comprise a core material layer and a back surface sandwich material layer. In case the module is not at least partially acting as front surface sandwich material layer a dedicated one has to be introduced into the SISBE between module and core material layer.

Such a sandwich structure applicable to all market available solar modules includes for example a front fibre reinforced thermoplastic or thermoset laminate that can be applied to the backside of a module by different means as for example gluing or by simply heating up the thermoplastic or thermoset structures of such front side sandwich material layer in order to make it adhere to the back side of a module. Further the core material layer of the sandwich may preferably but not limitedly comprise a foam like material and on the back side the sandwich may comprise the same or similar fibre reinforced thermoplastic or resin laminate used for said front side sandwich material layer. Instead of fibres other materials can be used too.

In a further embodiment the front and the back side sandwich material layers used in said sandwich structure may differ from one another.

In still another embodiment the solar module may only have a front glass and therefore the sandwich structure may be directly laminated on the backside of the back glass-free module. It is obvious that in such a configuration the module The core material can have an E-modulus varying between 10 MPa and 10000 MPa (for example a preferred PUR may have more than 66 MPa and a preferred glass foam at least 50 MPa; the so higher upper limit of 10 GPa is given by the general upper order of magnitude limit of polymer based materials' or other insulating core materials' E-moduluses). Additionally the thermal conductivity coefficient may be less than 0.1 W/mK and more than 0.001 W/mK (PUR has 0.03 W/mK and glass foam around 0.04 W/mK). A preferred combination would be glass fibre in an epoxy resin both as front and back side sandwich and PUR foam. Though, as it can be seen from the table different combinations are possible. Most important is the fact that every reinforcement, matrix and core material can be combined in any order. Only in the case that the solar module is the main component of the front side sandwich material layer, said solar module can only be used as such; in this case the front side sandwich material layer will be less thick than the back side sandwich material layer because the presence of the solar module contributes for better mechanical properties of the whole SISBE.

If the sandwich cannot be bought integrally from a supplier the different components can for example be glued together among such glues the most used ones are epoxy or acrylic based adhesives. In case of additional isolation properties additional core material can be added outside the sandwich as for example a further layer of the commercial available styrene based foam. These examples of sticking the different sandwich components together do not exclude other chemical or physical ways for reaching a proper adhesion.

In case of fibres embedded in a polymeric matrix it is of undisputable advantage if the fibres are preimpregnated. In this way the processing of at least a part of the sandwich with the pv module will be fast and economical although it is not absolutely necessary in order to exploit the invention.

In an additional preferred embodiment of the invention the lamination process may be performed by a laminator or a pressing machine and for instance directly while laminating the module.

In other embodiments means for enhancing weathering issues, for providing waterproof properties to the tile itself or to the whole roof structure, for extracting and/or dissipate the generated thermal energy as well as for storing, remitting into grid or transforming the thermal energy and the electricity generated, for enhancing fire retardant properties, for providing at least semi transparency, for enhancing roof aesthetics and integration may be added or integrated to the SISBE of the present invention by the person skilled in the art as it will be shown in the examples.

Of course such a structure would also imply an enhanced phonetic insulation with respect to a commercially available solar module.

7. SHORT PRESENTATION OF THE FIGURES

Example 1 illustrated in FIG. 1: SISBE containing photovoltaic module according to a preferred embodiment of the invention Example 2 illustrated in FIG. 2: photovoltaic module according to another embodiment of the invention whereas SISBE includes pv module as sandwich element Example 3 illustrated in FIG. 3: two of the inventive SISBEs are mainly comprised by a SISBE based roof including a waterproof foil and also acting as vapour barrier, and respectively placed between one SISBE and the next one and between the SISBEs and the mechanical sustaining roof structure as for example a rafter Example 4 illustrated in FIG. 4: a SISBE based roof including junction boxes for collecting the electricity generated by the SISBE's pv modules Example 5 represented in FIG. 5: a pv module comprising SISBE according to at least one of the previous examples, also includes a thermal collector forming so a hybrid SISBE.

Example 6 as shown in FIG. 6: SISBE containing solar thermal collector according to an embodiment of the invention Example 7 provided in FIG. 7: it shows different possible SISBE shapes and related applications on a roof Example 8 is shown in FIG. 8: the SISBE is now used as structural part for other building components

8. DESCRIPTION OF THE FIGURES

Figure 1:
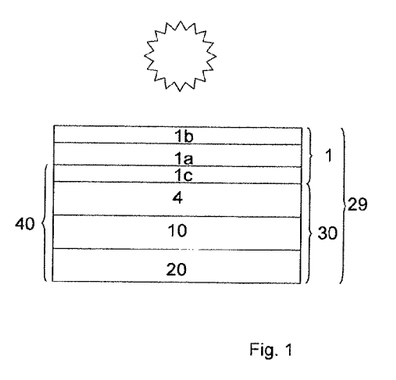

In example 1 a SISBE 29 comprises a pv module 1 disposed adjacent to a sandwich structure 30. The sandwich structure 30 comprises materials according to table 1 whereas said sandwich structure 30 comprises a front side sandwich (fss) material layer 4, core material layer 10 (core material) and a back side sandwich (bss) material layer 20. Preferably the sandwich comprises a reinforced glass fibre fss layer 4, a foamed polyurethane foam (FUR) core material 10 and a reinforced glass fibre bss layer 20. In another preferred embodiment the sandwich structure 30 comprises hemp fibres as reinforcement components in the fss 4 and/or bss 20. In a further preferred embodiment the sandwich structure 30 comprises basalt fibres as reinforcement components in the fss 4 and/or bss 20. In another further preferred embodiment the matrix material of the fss 4 and/or the bss 20 includes a epoxy resin as matrix material (e.g. Huntsman Tactix 123). In a further other embodiment the fss 4 and/or the bss 20 includes a thermoplast as matrix materials (e.g. polypropylene).

The thickness of the fss and the bss is in the order of 5 mm. The thickness of the foam material is 5 cm. In case of use of other materials as for example listed in table 1 or in case of both less or more mechanically stable construction depending on the type of application of the inventive SISBE thickness ranges may vary according to table 2:

| Thickness ranges | Front side sandwich - carrier 1 | Core material sandwich | Back side sandwich - carrier 2 |
| --- | --- | --- | --- |
| Invention ranges | 100 µm-1 cm | 20 mm-100 cm | 100 µm-1 cm |
| Preferred ranges | 0.25 mm-5 mm | 30 mm-50 cm | 0.25 mm-5 mm |
| Most preferred ranges | 0.5 mm-2.5 mm | 50 mm-30 cm | 0.5 mm-2.5 mm |

Table 2's ranges can be combined in different ways according to the different kinds of application. For example where mechanical stability is a must as in case of a roof or a city square where pedestrians walk on or even vehicles have access to, the fss and bss may have thicknesses belonging to the larger invention ranges since they'd display thicknesses up to 1 cm, while the core sandwich material may belong to a preferred or most preferred thickness range displaying an around 10 cm thick layer. The opposite may of course work too in case of lighter and less rigid structures whereas the fss and/or the bss may display thicknesses in the order of a mm or lower.

This combination of preferred and not preferred thicknesses may also work in case of structures displaying different thermal conductivity behaviours. For example in case of a private home the roof floor is a living room, a bed room or even an office and has therefore to be at a comfortable temperature throughout the year, the thickness of the core material sandwich might be well above 10 cm, the fss and bss may still display most preferred ranges around a few mm. In case of houses placed in cold climates, for example in mountain regions or in the north, the thickness of the insulating core material should be higher. The opposite may of course work too in case of more heat conducting structures whereas the fss and/or the bss may display thicknesses in the order of a few mm or lower.

In case of very hot climates an additional cooling means may be used: by providing small channels between the back surface of the pv module 1 and the sandwich 30 or directly in the core material layer 10.

On the other hand, instead of only at least just partially blocking the heat transmission at the back of the SISBE 29 by means of the sandwich 30, means for removing and/or exploiting the cumulated heat may be used too. For example said small channels in the sandwich 30, particularly in the core material 10 may be filled with flowing fluids connected to heat exploitation means known by the person skilled in the art may be appropriate to fulfil said task; other means like for example cooling serpentines connected to reservoirs or heat pumps, pyroelectric and thermoelectric materials like Peltier or Seebeck elements, vacuum pumps connected to Stirling engines, or any other cooling and heat exploiting mean known by the person skilled in the art may be appropriate to fulfil said task. Such means may at least partially be placed between layers and/or in the layers of the SISBE 30.

In a pv module 1a front glass 1b displaying 2 to 3 mm thickness is usually used, since up to now it represents the only material with the required parameters particularly in terms of mechanical, electrical and chemical stability as well as chemical barrier layer. Although the sandwich structure 30 at the back may provide important structural rigidity to the SISBE 29 including such a pv module 1, it may be preferable to keep such a thickness of the front glass 1b in order to not raise the risk of ruptures, even if thinner glasses such as display glasses may suit.

Further the pv module's 1 back covering material 1c may not include a back glass but instead it may comprise appropriate foils fulfilling the required parameters particularly in terms of electrical and chemical stability as well as chemical barrier layer. Such foils are composite foils which are very well known on the market as for instance market leaders Tedlar's and Icosolar's polymer based products. Such products are usually based for the back side of bulk silicon pv cells 1a. Though also in case of thin films economically viable polymer based back sheets are starting to be available. In case of such a pv module 1 without back glass but with a polymer based foil, the sandwich structure 30 would be directly glued on the pv module's 1 back surface covering material 1c comprising a polymeric based back surface material or in case of interesting mechanical properties of such polymer based foil, latter can act as fss 4 itself and therefore can be laminated directly with the other components of the sandwich 30 to the back of the pv cell 1a, but this may happen only in white room atmosphere in order to avoid detrimental contamination of the pv cells 1a. Another method could be to directly pre-laminate the sandwich structure 30 with the back sheet material 1c and then directly apply such a hybrid structure 40 to the back side of the pv cell 1a.

Figure 2:
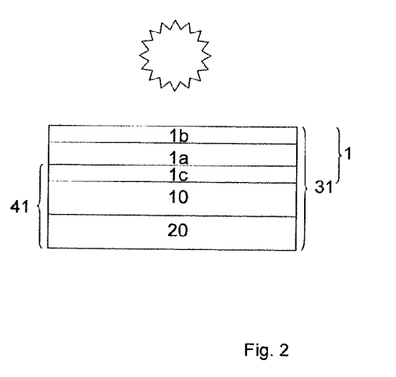

In example 2 illustrated in FIG. 2 a photovoltaic module containing SISBE 31 according to another embodiment of the invention is provided. In this case the SISBE 31 includes a pv module 1 directly as fss element. Bss 20 and core material 10 remain the same as in example 1, and in addition to the preferred materials they include in example 1, can therefore comprise every material or material combination as described in and not limited to table 1. This also works in case the back covering material 1c is not including glass but a polymer based foil. The possibility of pre-laminating the bss 20 and the core material 10 with the back covering material 1c is also provided as in example 1: in this case such a hybrid structure 41 would then be directly applied to the back side of the pv cell 1a. Regarding thicknesses, the ones concerning bss 20 and core material 10 would be exactly like in table 2 of example 1 while the fss, that in this case would substantially be represented by the pv module 1, would depend on the kind of pv module technology (thin film or bulk silicon) and on the kind of construction that said pv module 1 would display particularly in regard to the back covering material's 1c composition (with back glass or with polymer based foil). All additional features provided in Example 1 apply here too.

Figure 3:
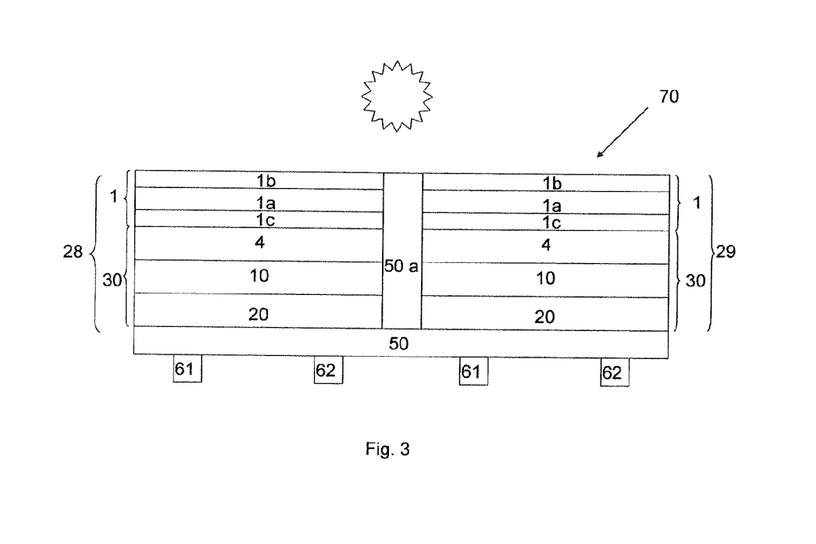

Example 3 shown in FIG. 3 provides the inventive SISBE 28 and 29 that are mainly comprised by a SISBE based roof 70 including a waterproof foil 50a and 50 also acting as vapour barrier, and respectively placed between one SISBE 29 and the next one 28 and between the SISBEs 28 and 29 and the mechanical sustaining roof structure as for example a rafter (61 and/or 62). The sides of the SISBE 28 and 29 representing in this example the external borders of a SISBE based roof 70 and which do not face each other as well as are not separated by the waterproof foil 50a can, also have a waterproof foil similar to the one in the middle 50a. The sustaining roof structure can include any mechanically suitable plates, bars or rods 61 and/or 62 comprising materials known by the person skilled in the art as for example wood, stone, armoured cement, metals as for instance aluminium or steel and/or composite materials among the most used ones. The waterproof foils 50 and 50a may comprise polysiloxane (silicone), butyl, metal/aluminium foil, polyethylene based foil, EVA and/or PVB; such layers 50 and 50a may also comprise more than one layer therefore forming a laminate waterproof foil. In some particular situations, as for example in some pitched roofs it is desirable to have a semi-permeable membrane which allows the cumulated vapour/humidity to leave a building; in this case either additional means as channels or passages in the roof support may be suitable or the middle foil 50a and at least partially the foil 50 may be permeable to vapour/humidity in one direction and impermeable to water and vapour/humidity in the other one.

In this specific example the cross section picture of FIG. 3 shows two rods 61 and 62 because the expert in the art knows that underneath the module and spaced apart from the module edge the pressure applied on the module can better be distributed into the sustaining structure that in case of this SISBE 28 or 29 is made of rods 61 and 62. Though, because of the high intrinsic mechanical rigidity of the SISBE 29 of the present invention the SISBE may lay on just one surface point or region in the middle or on one line in the middle of the SISBE itself. Oppositely, a plate may also work fine.

In case the module 1 or the relative SISBE 28 or 29 is already framed or laminated in a very qualitative way the waterproof foil 50a may not be required. In such a case the voids between one SISBE 28 and the next SISBE 29 are useful for draining water away from the SISBE 28,29 based roof 70. In case such channel derived from the avoidance of a waterproof foil 50a may be driving water into the sandwich structure 30 and/or if the SISBE 28,29 based roof is situated in regions with heavy rains it may further get at least partially coated with a waterproof foil 50a and/or coated with additional hydro repellent agents or insulating layers; another solution may be to use a foam with a closed porosity. In such a case the channel for draining water away from the SISBE based roof 70 is still provided.

In another preferred embodiment of Example 3 if the module 1 or the relative SISBE 28 or 29 is already framed or laminated in a very qualitative way even at the back surface of the SISBE 28 or 29 the waterproof foils 50 and 50a are not required. Further if the SISBE 28 or 29 is already framed or laminated in a very qualitative way only at its back surface, the waterproof foil 50 is not required while the waterproof foil 50a may at least partially be mandatory as previously said.

In a further embodiment of example 3 the waterproof foil 50 may be placed in-between at least one of the layers composing the SISBE. In another embodiment the waterproof foil 50 is placed between solar module 1 and SISBE 28 or 29.

In a still further embodiment of example 3 the waterproof foil may be placed on top of the SISBE facing the sun under the cumulative conditions of being at least partially transparent, waterproof, and both weathering and UV ray resistant.

All said possibilities may apply also for foils semi-permeable at least in one direction through its thickness.

This configurations all falling under example 3 apply to all possible SISBE solutions of the present invention and for instance to the ones listed in example 1 (30 and 40) as well as to the ones listed in example 2 (31 and 41).

SISBE 28 and 29 can be exactly the same or at least partially differ from each other.

Figure 4:
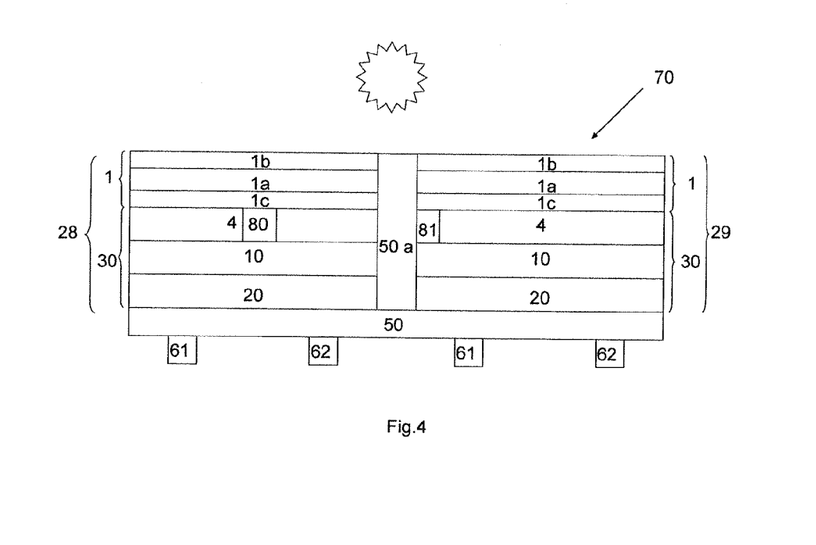

Example 4 shown in FIG. 4 provides the SISBE based roof 70 including the junction boxes 80 and 81 for collecting the electricity generated by the SISBE's pv modules 1. In the SISBE 28 the junction box 80 is placed in the middle of the back side surface of the module 1 as it is usual: in such a case the adjacent sandwich structures 30 may accommodate the junction box 80 by just providing the required space for the junction box in its structure itself. In case of very thin sandwich structures 30 the junction box 80 may even be thicker than the sandwich 30 and therefore the sandwich 30 would display a hole in its surface where it is required to accommodate the junction box 80. In case of SISBE 29 the junction box 81 is placed at the border of the module 1. In such a case the space to accommodate the junction box 81 in the sandwich 30 has to be provided at the border of the sandwich 30.

At this point the electricity accrued by the junction boxes 80 and 81 can be connected to an inverter or to a battery by cables as known by the person skilled in the art. The cables may pass through the sandwich 30, preferably through the core material 10 layer or between two different layers of the SISBEs 28 and 29 either by compressing the cables into the sandwich 30 or by leaving a not laminated channel within the sandwich 30.

This configurations all falling under example 4 apply to all possible SISBE solutions of the present invention and for instance to the ones listed in example 1 (30 and 40) as well as to the ones listed in example 2 (31 and 41).

Figure 5:
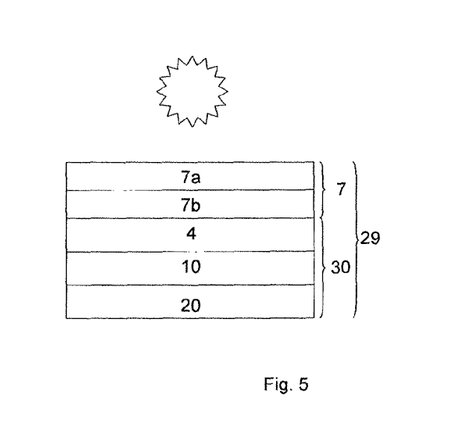

Example 5 is represented in FIG. 5. In this case a pv module comprising SISBE 29 according to at least one of the previous examples, also includes a thermal collector forming so a hybrid module. One of the biggest drawbacks of such hybrid modules which are not integrated in a SISBE is that as soon as the heat collector starts to heat up above around a 100° C. the efficiency of the superposed pv cells starts to drastically sink. Therefore a hybrid system needs further cooling means than standard thermal collector systems for pulling away the heat from the proximity of the pv cells; this is usually done by economically and energetically very inconvenient thermo pumps and related reservoirs where to direct the heated water, ventilators and/or similar heat removing means. Nowadays these means are further inhibiting the proper functions of the pv module because as soon as the cooling liquid, for example water, has same temperatures underneath the roof as in the reservoir, pumps get stopped; at this stage, namely the stagnation, the heat can reach 140° C. while staying under the hybrid module. Though the modern technologies provide many solutions for driving away such enormous heat and/or exploit it. This happens by using swimming pools or very big water reservoirs in general, optimized heat pumps and/or different geothermal solutions such as serpentines placed in the ground of a building, ground water storing or even underground tanks, pyroelectric materials like Peltier or Seebeck elements, vacuum pumps connected to Stirling engines, or any other cooling and heat exploiting mean known by the person skilled in the art which may be appropriate to fulfil said task. Such means may at least partially be placed between layers and/or in the layers of the SISBE 30. Important is just the fact that such heat removal systems do not waste more energy than they additionally help to create.

In particular FIG. 5 shows a SISBE 29 including a hybrid module 7 comprising a pv module 7a and a solar collector 7b. On the back according to example 1 a sandwich 30 is provided and it comprises the same fss 4, core material 10 and bss 20. of course the techniques for laminating are the same as in example 1 too. Further, as in example 1, also in this case the rear standard lamination of the module 7 can be avoided and replaced directly by the sandwich 30. Also same as in Example 2 the SISPBE 29 can include a hybrid module 7 directly as fss; in that case the SISBE would only comprise hybrid module 7, core material 10 and bss 20. Example 5 is further also applicable to both Example 3 and 4.

By adapting thicknesses of the sandwich 30 according to example 1 the thermal insulation can be steered. In this case though thicknesses have to be raised in order to adapt to the higher temperatures that can happen during said stagnation. Thicknesses can therefore double or even triplicate under same ambient conditions in respect to the figures provided in Example 1.

In case of very hot climates an additional cooling mean may be used: by providing small channels between the back surface of the pv module 1 and the sandwich 30 or directly in the core material layer 10.

On the other hand, instead of only at least just partially blocking the heat transmission at the back of the SISBE 29 by means of the sandwich 30, means for removing and/or exploiting the additionally cumulated heat may be used too. For example said small channels in the sandwich 30, particularly in the core material 10 may be filled with flowing fluids connected to heat exploitation means known by the person skilled in the art may be appropriate to fulfil said task; other means like for example cooling serpentines connected to reservoirs or heat pumps, pyroelectric and thermoelectric materials like Peltier or Seebeck elements, vacuum pumps connected to Stirling engines, or any other cooling and heat exploiting mean known by the person skilled in the art may be appropriate to fulfil said task. Such means may at least partially be placed between layers and/or in the layers of the SISBE 30.

Figure 6:
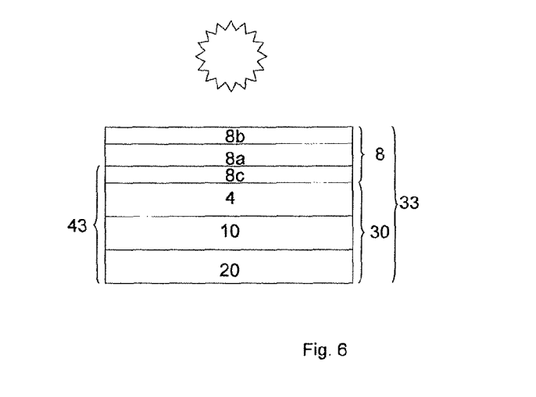

In Example 6 as shown in FIG. 6 a SISBE 33 containing a solar thermal collector 8 is provided. The flat panel thermal collector 8 includes a front glass 8b for maximum light income and minimum heat loss, an absorbing sheet including pipes 8a and a back insulating material 8c. The sandwich 30 is the same as for Example 1 and comprises a fss 4, a core material 10 and a bss 20. As mentioned in Example 5, due to the higher temperatures reached by solar collectors thicknesses of the different sandwich layers can double or even triplicate. Further in case the sandwich can withstand on its own the very high temperatures resulting at the back of the solar collector 8a, the back insulating material 8c, which is usually glass wool, is not necessary anymore. Further and analogously to Example 2 the solar collector 8 both provided or not with a back insulating material 8c can act by itself as ffs 4.

In case of the insulating material 8c displaying interesting mechanical properties and thermal insulating properties similar to those of the ffs 4 materials listed in table 1, then said insulating material 8c can at least partially substitute ffs 4 of the sandwich 30. Another method for producing the SISBE 33 could be to directly pre-laminate the sandwich structure 30 with the back sheet material 8c and then directly apply such a hybrid structure 43 to the back side of the solar collector 8a.

In Example 3 a roof 70 comprising two SISBE 28, 29 including pv modules 1 is given; such a roof construction is possible also using SISBEs 33 including thermal collectors 8. A roof 70 as in example 3 may comprise SISBEs including pv, hybrid and/or thermal modules. In Example 4 the junction boxes placement are introduced in case of a pv module. In case of the thermal collector of the present Example 6, similar means can be used for placing the tubes in charge of moving the water in and out of the thermal collector 8.

In case of evacuated tubes the solar thermal collector 8 would have only a collector layer 8a comprising the tubes and a back insulating material 8c while the front glass 8b would not be necessary anymore.

In case of very hot climates an additional cooling mean may be used: by providing small channels between the back surface of the pv module 1 and the sandwich 30 or directly in the core material layer 10.

On the other hand, instead of only at least just partially blocking the heat transmission at the back of the SISBE 29 by means of the sandwich 30, means for removing and/or exploiting the additionally cumulated heat may be used too. For example said small channels in the sandwich 30, particularly in the core material 10 may be filled with flowing fluids connected to heat exploitation means known by the person skilled in the art may be appropriate to fulfil said task; other means like for example cooling serpentines connected to reservoirs or heat pumps, pyroelectric and thermoelectric materials like Peltier or Seebeck elements, vacuum pumps connected to Stirling engines, or any other cooling and heat exploiting mean known by the person skilled in the art may be appropriate to fulfil said task. Such means may at least partially be placed between layers and/or in the layers of the SISBE 30.

Figure 7:
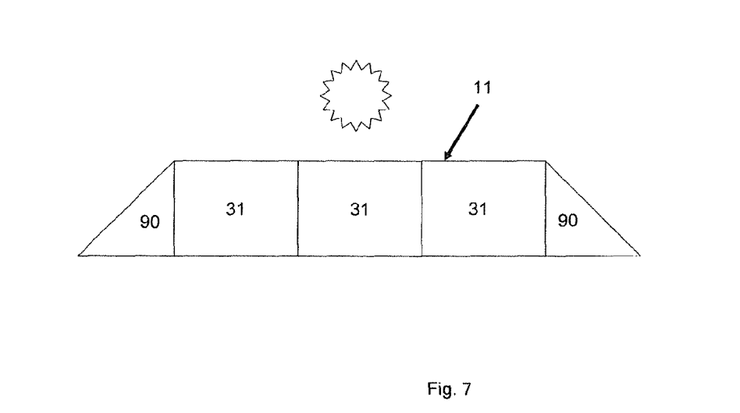

Example 7 is shown in FIG. 7 and it shows a side view of a house roof 11 wherein adjacent to the three standard SISBE 31 two not quadratic SISBEs 90 are placed. In case of thermal collector or crystalline bulk cells contained in SISBEs 90 the aforementioned examples all may apply. In case of thin film modules there are important differences; the thin film modules comprised by the SISBEs 90 must either have no photovoltaic function, e.g. they are simple dummies having only an aesthetical purpose, or another possibility whereas the pv functionality is given, is to use thin film solar modules where the area of each singularly serially connected cell is more or less the same and therefore power generation bottlenecks in single cells of the module can be avoided.

In a further embodiment of this example, between the SISBEs 31 a Velux or a non structural semitransparent module can be inserted instead of another SISBE 31 particularly for applications in penthouses or any other lighting need of the floor directly underneath the roof Finally this example shows an example of a pitched roof typical of a private house. This does not exclude all other building covering structures as for example flat or saw toothed roofs.

Figure 8:
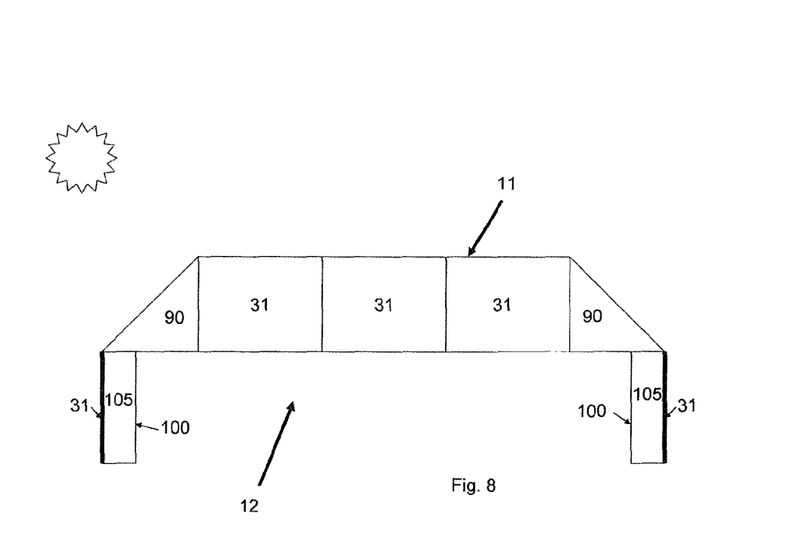

Example 8 is shown in FIG. 8 whereas the SISBE 31 is now used as structural part for other building 12 components 105. In case SISBE 31 is comprised by building 12 parts other than the roof 11, as for instance a wall element 105, a spatially distant panel 100 may be used either for better insulation, with or without further insulating material as for example glass wool and/or for providing space or passage for tubes or connections of the building. In a further case if the wall element 105 is structurally forming the building 12, further reinforcements may be used as for instance armoured concrete, metal structures and/or thicker sandwich structures than the one listed in example 1.

The panel 100 may be made of gypsum plaster board for example.

Conclusion

By using the construction element of the present invention, for instance a SISBE, a disruptive and economic combination between building construction and solar system installation is possible.

The invention claimed is:

1. A substantially two-dimensional construction element for roof-construction, comprising
    a solar energy photovoltaic converter panel comprising photovoltaic cells and a panel substrate, the photovoltaic converter panel extending along and defining one surface of said construction element and providing for solar energy conversion;
    a building construction member, extending along and defining the second surface of said construction element and providing for construction requirements;
    wherein the photovoltaic converter panel is integral with the construction member and is one layer of a layer stack comprising the construction member,
        the layer stack including a core material layer of at least one of a foam, a honeycomb, a fabric and a glass wool, having a thickness of between 50 mm and 30 cm, and having a thermal conductivity coefficient between 0.1 W/mK and 0.001 W/mK to provide for thermal roof insulation,
        the layer stack further comprising a front surface layer of one of a composite material and of a metal and having a thickness of between 0.25 mm to 5 mm chemically bonded on said core material layer, and
        the construction element being constructed so that provides at least predominantly the requirements of the roof-building construction with respect to thermal isolation and mechanical toughness and rigidity.

2. A construction element according to claim 1 further comprising a back surface material layer.

3. A construction element according to claim 1 wherein the chemically bonded layers are glued together.

4. A construction element according to claim 3 wherein the layers glued together are glued by at least one of an acrylic based glue and an epoxy based glue.

5. A construction element according to claim 1 wherein photovoltaic cells of the converter panel comprise thin film photovoltaic cells.

6. A construction element according to claim 1 wherein photovoltaic cells of the converter panel comprise bulk material photovoltaic cells.

7. A construction element according to claim 1 wherein photovoltaic cells of the converter panel comprise organic material photovoltaic cells.

8. A construction element according to claim 1 further comprising solar thermal collectors.

9. A construction element according to claim 1 further comprising Peltier elements.

10. A construction element according to claim 1 wherein the photovoltaic cells are selected from the group consisting of thin film photovoltaic cells and bulk photovoltaic cells.

11. A construction element according to claim 1 wherein the core material layer comprises at least one of glass foam, polypropylene foam, reinforced foams, PMI foam, PUR foam, PEEK foam, copolymer foam and styrene based foam.

12. A construction element according to claim 1 wherein the core material layer comprises at least one of phenolic paper honeycomb and polypropylene honeycomb.

13. A construction element according to claim 1 wherein the core material layer comprises at least one of 3 D fabric and glass wool.

14. A construction element according to claim 1 wherein the core material layer comprises a combination of at least two of a foam, a honeycomb, a fabric and a glass wool.

15. A construction element according to claim 1 wherein the front surface layer is a composite material of at least one of glass fibre, hemp fibre, and basalt fibre.

16. A construction element according to claim 1 wherein the front surface layer is a composite material comprising a matrix of at least one of polypropylene, epoxy resin, polyester resin, vinylesther resin, and phenolic resin.

17. A construction element according to claim 1 comprising a back surface layer of at least one of aluminium and a glass plate.

18. A construction element according to claim 1 wherein the layer stack comprises a back surface layer having a thickness of between 100 µm and 1 cm.

19. A construction element according to claim 1 comprising a back surface layer of the same material as the front surface layer.

20. A construction element according to claim 1 wherein layers of the layer stack are laminated together by at least one of heat and pressure.

21. A construction element according to claim 1 wherein the surface extent of the construction element is between 10 cm$^2$ and 100 m$^2$.

22. A construction element according to claim 1 comprising means for hosting a junction box and connecting cables in order to collect the electricity generated by the converter panel.

23. A construction element according to claim 1 comprising means for hosting pipes for a fluid able to remove cumulated heat.

24. A construction element according to claim 23 wherein at least a part of the means for hosting pipes are provided within the core material layer.

25. A construction element according to claim 1 wherein the core material layer is of a foam having E-modulus varying between 10 MPa and 10 GPa.

26. A construction element according to one of claim 1, wherein the maximum geometric extension of the construction element is at least 70 cm.

27. A roof surface construction comprising at least one construction element according to claim 1 wherein following elements are included:
a dedicated support structure;
membranes stopping water from penetrating into the interior of the construction allowing vapor to filter to the exterior of the construction; and
means for fixing the at least one construction element with a dedicated rafter.

28. A roof surface construction according to claim 27 comprising dummy construction elements with no photovoltaic converter panels.

29. A roof surface construction according to claim 27 wherein the water stopping membranes are of at least one of polyethylene and a polysiloxane based compound.

30. A building comprising a roof surface construction with at least one construction element according to claim 1.

* * * * *